(12) United States Patent
Smith et al.

(10) Patent No.: US 7,795,937 B2
(45) Date of Patent: Sep. 14, 2010

(54) SEMI-DIGITAL DELAY LOCKED LOOP CIRCUIT AND METHOD

(75) Inventors: Sterling Smith, Hsinchu Hsien (TW);
Ellen Chen Yeh, Hsinchu Hsien (TW);
Wen cai Lu, Shanghai (CN)

(73) Assignee: MStar Semiconductor, Inc. (TW)

( * ) Notice: Subject to any disclaimer, the term of this patent is extended or adjusted under 35 U.S.C. 154(b) by 13 days.

(21) Appl. No.: 12/402,815

(22) Filed: Mar. 12, 2009

(65) Prior Publication Data
US 2009/0243679 A1 Oct. 1, 2009

Related U.S. Application Data

(60) Provisional application No. 61/039,440, filed on Mar. 26, 2008.

(51) Int. Cl.
*H03L 7/06* (2006.01)
(52) U.S. Cl. .................................. 327/158; 327/149
(58) Field of Classification Search ................ 327/149, 327/158
See application file for complete search history.

(56) References Cited

U.S. PATENT DOCUMENTS

| | | | | |
|---|---|---|---|---|
| 6,151,152 | A * | 11/2000 | Neary | 359/216.1 |
| 6,288,574 | B1 * | 9/2001 | Neary | 327/12 |
| 6,362,898 | B1 * | 3/2002 | McDonald | 358/1.7 |
| 6,803,834 | B1 * | 10/2004 | Chen | 331/179 |
| 7,492,849 | B2 * | 2/2009 | On et al. | 375/376 |
| 7,496,168 | B2 * | 2/2009 | Leonowich et al. | 375/376 |
| 7,679,454 | B2 * | 3/2010 | Kuan et al. | 331/11 |
| 2003/0198311 | A1 * | 10/2003 | Song et al. | 375/376 |
| 2005/0162552 | A1 * | 7/2005 | Xiu et al. | 348/521 |
| 2006/0245531 | A1 * | 11/2006 | Leonowich et al. | 375/376 |
| 2006/0256909 | A1 * | 11/2006 | On et al. | 375/376 |
| 2006/0268172 | A1 * | 11/2006 | Chang et al. | 348/512 |
| 2009/0003724 | A1 * | 1/2009 | Uratani et al. | 382/268 |
| 2009/0147903 | A1 * | 6/2009 | Kikuchi et al. | 375/376 |

\* cited by examiner

*Primary Examiner*—Lincoln Donovan
*Assistant Examiner*—Adam D Houston
(74) *Attorney, Agent, or Firm*—Edell, Shapiro & Finnan, LLC

(57) ABSTRACT

A scalable DLL (delay locked loop) circuit that has a calibration mechanism to auto tune locking precision. The delay locked loop circuit includes a multi-phase phase locked loop circuit for generating a plurality of phase signals according to a system clock, wherein one of the phase signals is a pixel clock; a phase detector for detecting an integral phase error and a fractional phase error between a reference signal and a feedback signal according to the pixel clock; a phase selector for selecting one of the phase signals according to the fractional phase error; and a delay circuit for shifting the phase of the reference signal according to the integral phase error and the selected phase signal to generate an output signal.

16 Claims, 5 Drawing Sheets

SEMI-DIGITAL DELAY LOCKED LOOP CIRCUIT AND METHOD

CROSS REFERENCE TO RELATED PATENT APPLICATION

This application claims the benefit of U.S. provisional patent application No. 61/039,440 filed on Mar. 26, 2008.

FIELD OF THE INVENTION

The present invention relates to a scalable DLL (delay locked loop) circuit for tuning locking precision.

BACKGROUND OF THE INVENTION

Synchronous sequential systems rely on globally synchronized clocks. With the increase in clock rates, low-skew clock distributions are becoming increasingly critical to achieving design speed objectives. High-speed circuits may also require clocks with programmable duty cycle and delay. For all these applications, comprehensive clock management is necessarily implemented on a chip. The Phase- and Delay-Locked Loops are used to achieve low clock skew distributions. The principles of frequency synthesis, by which the clock rates can be multiplied and divided, are outlined, together with its applications. The basic idea of the active closed-loop clock skew compensation is to reduce exactly as much clock skew as needed. This is achieved by using circuitry that can generate a clock signal, or modulate its delay. Typically, such compensation is placed in incoming clock buffers. The overall effect is equivalent to that of inserting negative delay in the clock path. Note that any of the passive techniques for reducing clock skew with layout and clock network speed optimizations cannot completely reduce the clock skew. Only the use of the closed-loop clock skew reduction can lead to that goal. Active skew compensation can be achieved by using either PLLs or DLLs—both compare the input and feedback clocks, and guarantee that they are aligned. The difference between the two is in the use of the internal delay line. In DLLs, the delay line inserts the controlled delay between the input and output clock. In PLLs, the delay line is used as a ring oscillator that is realized by closing the loop and guaranteeing that the inverted output of the delay line is fed back. Hence, while DLLs only delay the incoming clock signals, the PLLs actually generate a new clock signal in such a way that the delay in the clock distribution is completely eliminated.

The basic delay locked loop (DLL) circuit consists of a phase detector, a loop filter and a voltage controlled delay line. The phase detector measures the relationship (lead/lag) between the input and the output signals. The loop filter integrates the phase error and cancels high frequency jitter. Then the output of loop filter changes the voltage of the voltage controlled delay line to make the input signal and the output signal in phase.

Operation of the DLL is as follows. First, the phase detector detects the output signal leading/lagging the input signal. The difference in phase between the input and the output is called phase error. Then, phase error is integrated in the loop filter. Depending on the output voltage of the loop filter, it either makes voltage controlled delay with larger or smaller delay, until the phase error is zero or very small. At this point, it is called "locked". When the DLL is locked, the delay time between the input and the output signals is equal to the static phase offset.

But in a video system, a higher resolution display requires a higher frequency pixel clock, and smaller DLL jitter. The basic DLL circuit as above can not meet the requirements.

SUMMARY OF THE INVENTION

The present invention relates to a semi-digital DLL (delay locked loop) circuit whose locking precision is tunable. Such a circuit is advantageous in systems where DLL jitter needs to be inversely proportional to system speed. For example, in a video system, a higher resolution display requires a higher frequency pixel clock, and smaller DLL jitter.

The present invention provides a delay locked loop circuit. The delay locked loop circuit comprises a multi-phase phase locked loop circuit for generating a plurality of phase signals according to a system clock, wherein one of the phase signals is a pixel clock; a phase detector for detecting an integral phase error and a fractional phase error between a reference signal and a feedback signal according to the pixel clock; a phase selector for selecting one of the phase signals to be a selected phase signal according to the fractional phase error; and a delay circuit for shifting the phase of the reference signal according to the integral phase error and the selected phase signal to generate an output signal, wherein the feedback signal is associated with the output signal.

The present invention provides a method for adjusting the phase between a reference signal and a feedback signal. The method comprises steps of generating a plurality of phase signals according to a system clock, wherein one of the phase signals is a pixel clock; detecting an integral phase error and a fractional phase error between the reference signal and the feedback signal according to the pixel clock; selecting a selected phase signal from the phase signals according to the fractional phase error; and shifting the phase of the reference signal according to the integral phase error and the selected phase signal to generate an output signal, wherein the feedback signal is associated with the output signal.

The present invention provides a phase detecting circuit using in delay locked loop circuit. The phase detecting circuit comprises a multi-phase phase locked loop circuit for generating a plurality of phase signals according to a system clock, wherein one of the phase signals is a pixel clock used in a video system; a phase detector for calculating an integral phase error and a fractional phase error between a reference signal and a feedback signal according to the pixel clock; and a phase selector for generating a selected phase signal according to the fractional phase error and the phase signals.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
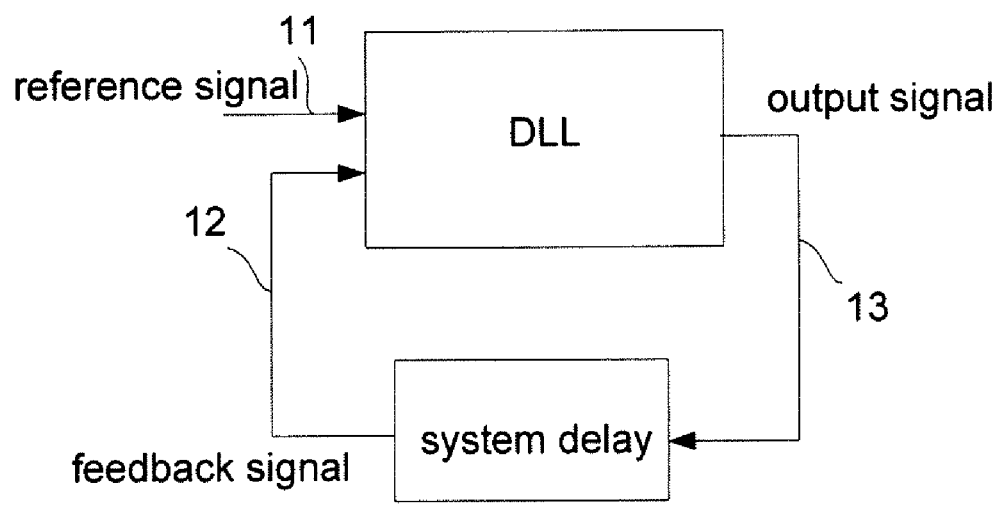
FIG. 1 shows a block diagram including a DLL circuit.
Figure 2:
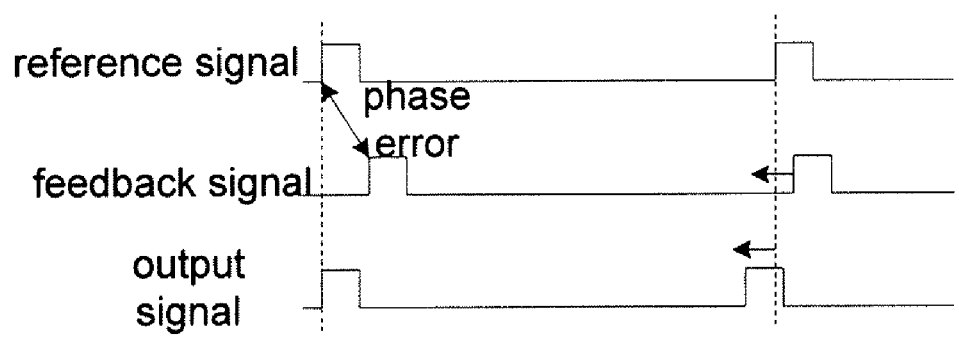
FIG. 2 shows a timing diagram for the DLL circuit.

A view of a DLL in a system is shown in FIG. 1. A reference signal 11 is generated internally. For example in a video system, this reference signal 11 is obtained by processing the horizontal synchronization signal (HSYNC). An output signal 13 of the DLL triggers some activities on the system board and after some delays returns a feedback signal 12 to the DLL. The objective of the DLL is to adjust the phase of the output signal 13 such that feedback signal 12 is aligned or be at a fixed offset from reference signal 11. FIG. 2 shows the relationship among the three signals.

Figure 3:
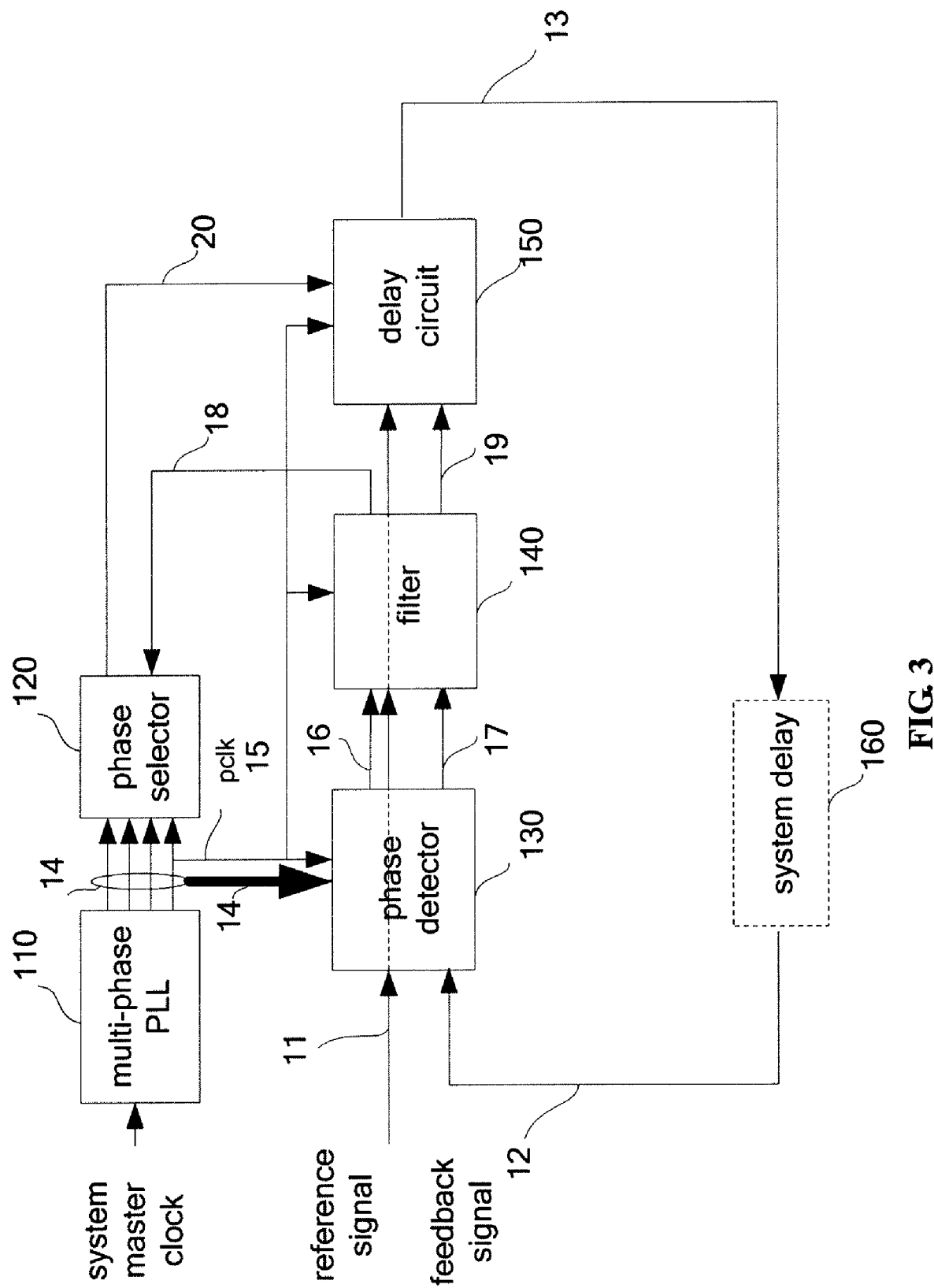
FIG. 3 shows an embodiment of the DLL circuit according to the invention.

The DLL architecture in the invention, with reference to FIG. 3 showing a block diagram, includes a multi-phase PLL 110, a phase selector 120, a phase detector 130, a filter 140 and a delay circuit 150. The multi-phase PLL 110 generates a set of clocks 14 by subdividing one clock period of a system master clock into evenly-spaced phases. The PLL frequency is programmable. The DLL jitter is inversely proportional to the PLL frequency. One of the clocks generated by the PLL 110 is a pclk 15. For example in the video system, the pclk 15 is the pixel clock or also called the dot clock. The pclk 15 is the common clock of the phase detector 130, the filter 140, and the delay circuit 150. The phase detector 130 receives the reference signal 11 and the feedback signal 12, and calculates an integral phase error 16 and a fractional phase error 17 between the reference signal 11 and the feedback signal 12 by using the pclk 15. The integral phase error 16 is associated with an integral multiple of the pclk 15 and the fractional phase error 17 is associated with a fractional of pclk 15. The filter 140 receives the integral phase error 16 and the fractional phase error 17 and generates an integral output phase 19 and a fractional output phase 18 accordingly. The integral output phase 19 produced by the filter 140 is used by the delay circuit 150. The fractional output phase 18 produced by the filter 140 is used by the phase selector 120 to shift the phase of the output signal 13 by a fraction of the pclk 15. The phase selector 120 produces a selected phase 20 and sends it to the delay circuit 150. The delay circuit 150 shifts the phase of the reference signal according to the integral output phase 19 and the selected phase 20 to generate the output signal 13. The output signal 13 of the DLL triggers some activities on the system board, and after some delays by a system delay 160 returns a feedback signal 12 to the DLL. The system delay 160 comes from the output signal 13 which passes through the system board and feedback into the DLL circuit. And the system delay may be changed due to the temperature change.

Figure 4:
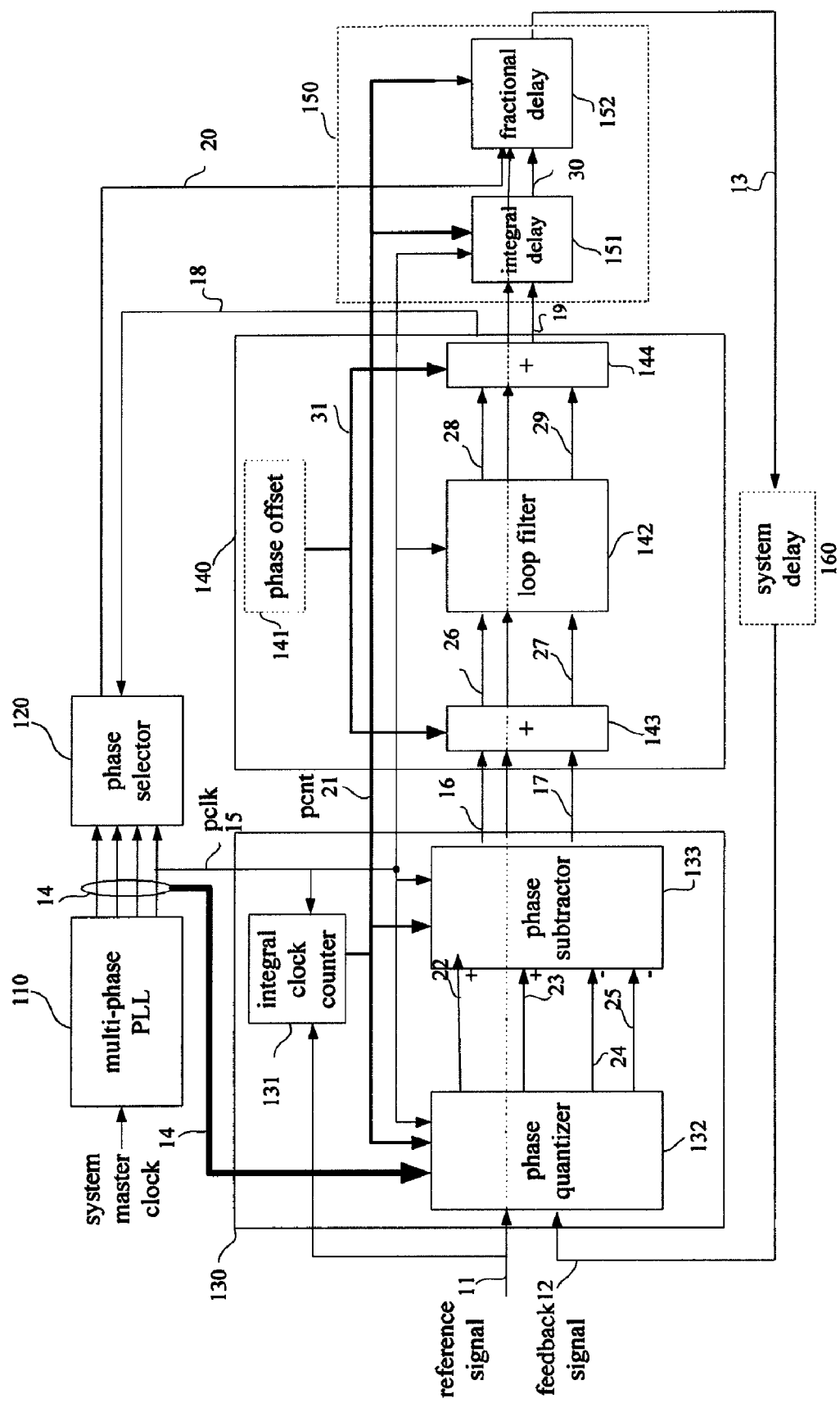
FIG. 4 shows further details of the embodiment shown in FIG. 3.
Figure 6:
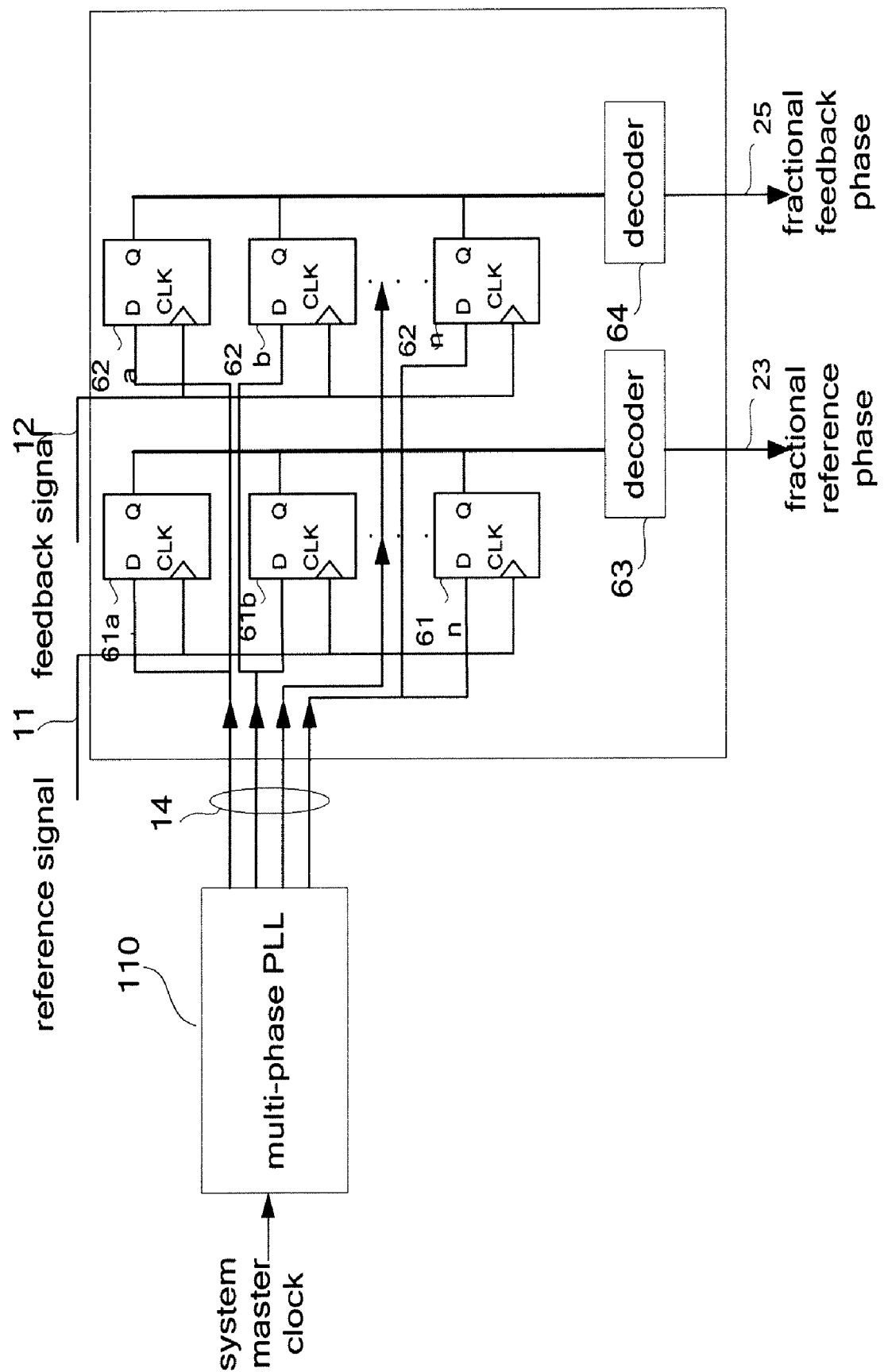
FIG. 6 is a possible structure of a time-to-digital converter.

FIG. 4 shows one preferred embodiment of the invention in detail. The phase detector 130 as the same disclosed in FIG. 3 includes an integral clock counter 131, a phase quantizer 132, and a phase subtractor 133. The integral clock counter 131 counts between successive rising edges of the reference signal 11 and produces a count pcnt 21. The number of bits of integral clock counter 131 sets the locking range of the DLL. Rising edge of the reference signal 11 resets the integral clock counter 131 and always falls on a fixed count called an integral reference phase 22. At the rising edge of the feedback signal 12, the pcnt 21 is stored as an integral feedback phase 24. The phase quantizer 132 is used to respectively detect the rising edge of the reference signal 11 and the feedback signal 12, and read the count pcnt 21 as an integral reference phase 22, a fractional reference phase 23, an integral feedback phase 24, and a fractional feedback phase 25. The fractional phase error between the reference signal 11 and the feedback signal 13 is calculated by a time-to-digital converter in the phase quantizer 132. An example of a fractional time-to-digital converter according to the invention is shown in FIG. 6. The difference calculated by the phase subtractor 133 between the integral reference phase 22 and the integral feedback phase 24 is the integral phase error 16, and the difference calculated by the phase subtractor 133 between the fractional reference phase 23 and the fractional feedback phase 25 is the fractional phase error 17.

The filter 140 includes a phase offset 141, a loop filter 142, and two adders 143, 144. A phase offset compensation is used to shift an instantaneous phase signal in phase to compensate for a phase offset resulting from the jitter of pclk 15. Two adders, 143 and 144, are placed before and after the loop filter 142 so an instantaneous phase offset can be added to the output signal 13 without the delay of the loop filter 142. The adder 144 comes after the loop filter 142 so the phase offset takes effect instantaneously without being filtered. The other adder 143 before the loop filter 142 adds this intentional offset into the phase error so the added phase offset is not cancelled by the loop filter 142. An integral offset phase error 26 outputted by the adder 143 is filtered by the loop filter 142, and becomes an integral filtered phase error 28. A fractional offset phase error 27 outputted by the adder 143 is filtered by the loop filter 142, and becomes a fractional filtered phase error 29. Then the loop filter sends the integral filtered phase error 28 and the fractional filtered phase error 29 into adder 144. An example of adding this instantaneous phase offset is in the CRT deflection system where a different pre-calculated phase offset value is added per video line to correct geometric distortions inherent in the tube.

The delay circuit 150 is a two-stage delay circuit including an integral delay 151 and a fractional delay 152. The output signal 13 is produced by the delay circuit 150 according to the integral output phase 19 and the selected phase 20. The integral delay 151 shifts the phase of the reference signal 11 according to the integral output phase 19 to generate an integral delayed signal 30. The fractional output phase 18 of the filter 140 is used by the phase selector 120 so as to generate the selected phase 20 by the fraction of the pclk 15. Then, the fractional delay 152 shifts the phase of the integral delayed signal 30 according to the selected phase 20 to generate the output signal 13.

Figure 5:
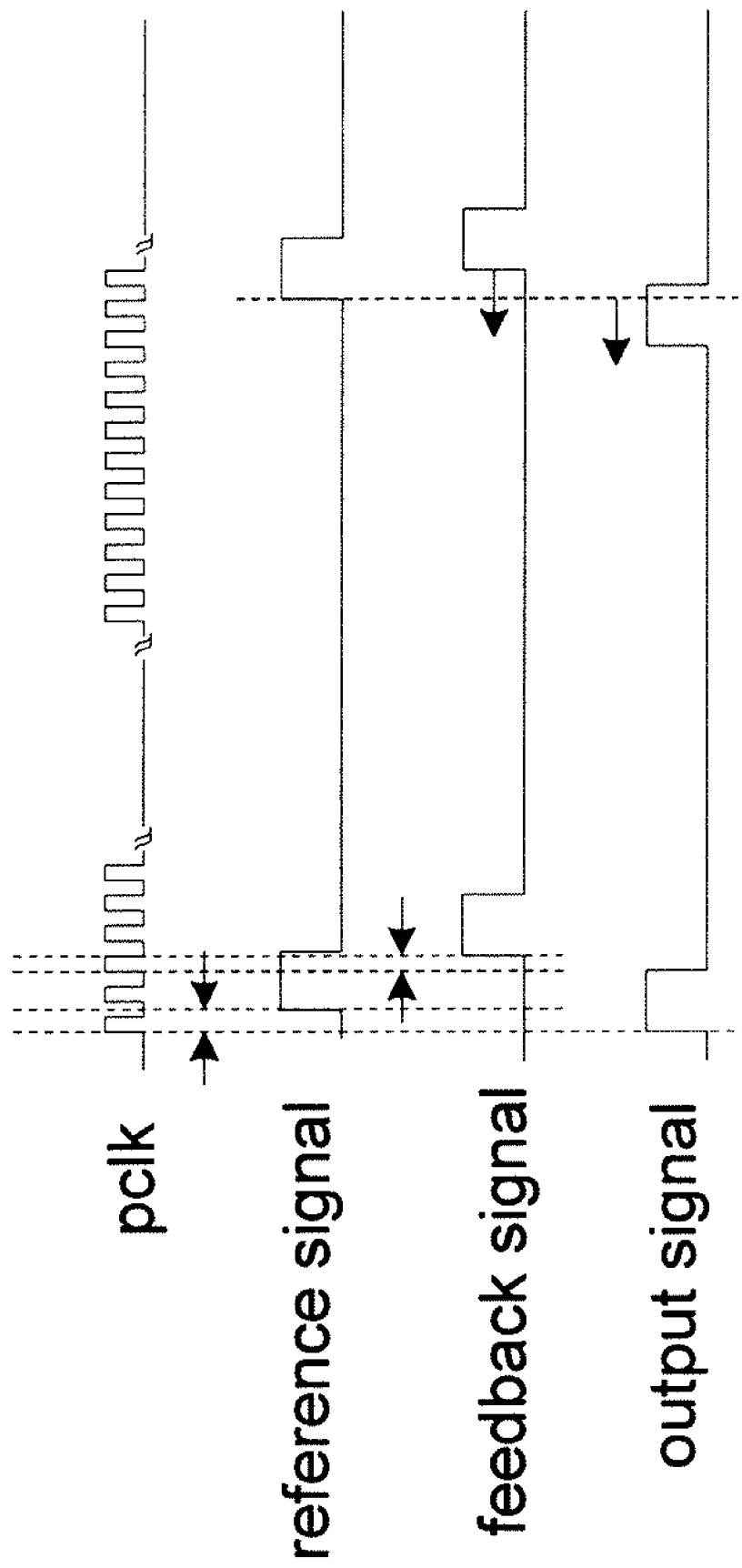
FIG. 5 shows a timing diagram for an embodiment according to the invention.

FIG. 5 shows the timing diagram of the embodiment according to the invention. Compared to the traditional DLL implementation, the new DLL architecture employs a common clock pclk 15 and a common count pcnt 21. Both the reference signal 11 and the feedback signal 12 are measured relative to the pclk 15 and the pcnt 21 as shown in FIG. 5. Rising edge of the reference signal 11 resets the integral clock counter 131 and always falls on a fixed count called the integral reference phase 22. At the rising edge of the feedback signal 12, the pcnt 21 is stored as the integral feedback phase 24. The difference between the integral reference phase 22 and the integral feedback phase 24 is the integral phase error 16. The fractional phase error between reference signal 11 and feedback signal 13 is calculated by a time-to-digital converter in the phase quantizer 132.

FIG. 6 shows an example of a fractional time-to-digital converter. At the rising edge of the reference signal 11, a set of flip flops 61a~61n latch in the multi-phase PLL output clocks 14. A decoder 63 of the flip flops' output is the fractional reference phase 23. Another set of flip flops 62a~62n latch in the PLL output clocks 14 at the rising edge of the feedback signal 12. A decoder 63 of the flip flops' output is the fractional feedback phase 25. The difference between fractional reference phase 23 and the fractional feedback phase 25 is the fractional phase error 19. The above method also applies for measuring the falling edge or a weighted average of the rising and falling edges of the feedback signal. This flexibility is very useful for systems where both rising and falling edge phases carry important information, such as in a CRT deflection system.

According to one embodiment, the present invention provides a method for adjusting the phase between a reference signal and a feedback signal. The method comprises steps of generating a plurality of phase signals according to a system clock, wherein one of the phase signals is a pixel clock used in a video system; calculating an integral phase error and a fractional phase error between a reference signal and a feedback signal by the pixel clock; generating a phase shift output signal according to the fractional phase error and the phase signals; and generating an output signal by phase shifting according to the integral phase error and the phase shift output signal, wherein the output signal after some delays returns the feedback signal. More specifically, the step of calculating an integral phase error and a fractional phase error comprises steps of counting the pulse of the pixel clock according to the reference signal to generate a count; receiving the reference signal and the feedback signal to generate an integral reference phase, a fractional reference phase, an integral feedback phase and a fractional feedback phase according to the count, the pixel clock and the phase signals; and calculating the difference between the integral feedback phase and the integral feedback phase to generate the integral phase error, and calculating the difference between the fractional feedback phase and the fractional feedback phase to generate the fractional phase error.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A delay locked loop circuit, comprising:
   a multi-phase phase locked loop circuit for generating a plurality of phase signals according to a system clock, wherein one of the phase signals is a pixel clock;
   a phase detector for detecting an integral phase error and a fractional phase error between a reference signal and a feedback signal according to the pixel clock;
   a phase selector for selecting one of the phase signals to be a selected phase signal according to the fractional phase error; and
   a delay circuit for shifting the phase of the reference signal according to the integral phase error and the selected phase signal to generate an output signal, wherein the feedback signal is associated with the output signal.

2. The delay locked loop circuit as claimed in claim 1, wherein the phase detector comprises:
   an integral clock counter for counting the pulse of the pixel clock to generate a count;
   a phase quantizer for generating an integral reference phase, a fractional reference phase, an integral feedback phase and a fractional feedback phase according to the reference signal, the feedback signal, the count and the phase signals; and
   a phase subtractor for calculating the difference between the integral feedback phase and the integral feedback phase to generate the integral phase error, and calculating the difference between the fractional feedback phase and the fractional feedback phase to generate the fractional phase error.

3. The delay locked loop circuit as claimed in claim 2, wherein the integral clock counter is reset at each rising edge of the reference signal.

4. The delay locked loop circuit as claimed in claim 2, wherein the phase quantizer generates the integral reference phase and the integral feedback phase by reading the count at the rising edge of the reference signal and the feedback signal respectively.

5. The delay locked loop circuit as claimed in claim 2, wherein the phase quantizer generates the fractional reference phase and the fractional feedback phase by comparing the reference signal and the feedback phase with the phase signals respectively.

6. The delay locked loop circuit as claimed in claim 2, wherein the phase quantizer comprises a time-to-digital converter for generating the fractional reference phase and the fractional feedback phase according to the reference signal, the feedback phase and the phase signals.

7. The delay locked loop circuit as claimed in claim 1, further comprising:
   a loop filter unit for filtering the integral phase error and the fractional phase error outputted by the phase detector to generate an integral output phase to the delay circuit and the fractional output phase to the phase selector.

8. The delay locked loop circuit as claimed in claim 7, further comprising:
   a phase offset unit for providing an instantaneous phase offset of the pixel clock;
   a first adder for adding the instantaneous phase offset into the integral phase error and the fractional phase error before the loop filter; and
   a second adder for adding the instantaneous phase offset into the integral output phase and the fractional output phase after the loop filter.

9. A method for adjusting the phase between a reference signal and a feedback signal, the method comprising steps of:
   generating a plurality of phase signals according to a system clock, wherein one of the phase signals is a pixel clock;
   detecting an integral phase error and a fractional phase error between the reference signal and the feedback signal according to the pixel clock;
   selecting a selected phase signal from the phase signals according to the fractional phase error; and
   shifting the phase of the reference signal according to the integral phase error and the selected phase signal to generate an output signal, wherein the feedback signal is associated with the output signal.

10. The method as claimed in claim 9, wherein the step of detecting an integral phase error and a fractional phase error comprises steps of:
    counting a pulse of the pixel clock to generate a count;
    generating an integral reference phase, a fractional reference phase, an integral feedback phase and a fractional feedback phase according to the reference signal, the feedback signal, the count and the phase signals; and
    calculating the difference between the integral feedback phase and the integral feedback phase to generate the integral phase error and calculating the difference between the fractional feedback phase and the fractional feedback phase to generate the fractional phase error.

11. The method as claimed in claim 9, wherein the reference signal is obtained by processing a horizontal synchronization signal.

12. The method as claimed in claim 10, wherein the count is reset to zero at each rising edge of the reference signal.

13. The method as claimed in claim 10, wherein the integral reference phase and the integral feedback phase are generated by reading the count at the rising edge of the reference signal and the feedback signal respectively.

14. The method as claimed in claim 10, wherein the fractional reference phase and the fractional feedback phase are generated by comparing the reference signal and the feedback phase with the phase signals respectively.

15. The method as claimed in claim 9, further comprising:
filtering the integral phase error and the fractional phase error to generate an integral output phase and a fractional output phase.

16. The method as claimed in claim 15, further comprising:
adding the instantaneous phase offset into the integral phase error and the fractional phase error before the filtering step; and
adding the instantaneous phase offset into the integral output phase and the fractional output phase after the filtering step.

* * * * *